(12) United States Patent
Kang et al.

(10) Patent No.: US 11,744,077 B2
(45) Date of Patent: Aug. 29, 2023

(54) VERTICAL MEMORY DEVICES AND METHODS OF MANUFACTURING THE SAME

(71) Applicant: SAMSUNG ELECTRONICS CO., LTD., Suwon-si (KR)

(72) Inventors: Sangmin Kang, Hwaseong-si (KR); Hanvit Yang, Suwon-si (KR); Jihoon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 367 days.

(21) Appl. No.: 17/173,179

(22) Filed: Feb. 10, 2021

(65) Prior Publication Data

US 2021/0384200 A1   Dec. 9, 2021

(30) Foreign Application Priority Data

Jun. 9, 2020   (KR) ........................ 10-2020-0069614

(51) Int. Cl.
*H10B 43/27*   (2023.01)
*H10B 43/35*   (2023.01)

(52) U.S. Cl.
CPC .............. *H10B 43/35* (2023.02); *H10B 43/27* (2023.02)

(58) Field of Classification Search
CPC ......... H01L 27/11524; H01L 27/11529; G11C 16/0483; H10B 43/20; H10B 43/23; H10B 43/27; H10B 43/30; H10B 43/35
See application file for complete search history.

(56) References Cited

U.S. PATENT DOCUMENTS

| | | |
|---|---|---|
| 6,424,001 B1 | 7/2002 | Forbes et al. |
| 8,685,832 B2 | 4/2014 | Watanabe |
| 9,145,604 B2 | 9/2015 | Kakimoto et al. |
| 10,269,821 B2 | 4/2019 | Shingu et al. |
| 10,381,376 B1 | 8/2019 | Nishikawa et al. |
| 2012/0115293 A1 | 5/2012 | Noh et al. |

(Continued)

FOREIGN PATENT DOCUMENTS

JP   2010141046 A   *   6/2010

OTHER PUBLICATIONS

Machine translation of JP-2010141046-A, 2010.*

*Primary Examiner* — Suberr L Chi
*Assistant Examiner* — Carnell Hunter, III
(74) *Attorney, Agent, or Firm* — F. Chau & Associates, LLC

(57) ABSTRACT

A mold including insulation layers and sacrificial layers is formed on a substrate. A channel hole is formed through the mold. A first deposition process is performed using a first precursor including silane and a second precursor including silane and a halogen element to form a first preliminary blocking layer on a sidewall of the channel hole. A second deposition process is performed using the first precursor to form a second preliminary blocking layer on the sidewall of the channel hole. The first and second preliminary blocking layers form a third preliminary blocking layer. An oxidation process is performed on the third preliminary blocking layer to transform the third preliminary blocking into a first blocking layer. A charge storage layer, a tunnel insulation layer, and a channel layer are formed on the first blocking layer. The sacrificial layer is replaced with a gate electrode.

20 Claims, 14 Drawing Sheets

(56) References Cited

U.S. PATENT DOCUMENTS

| | | |
|---|---|---|
| 2013/0273704 A1 | 10/2013 | Jee et al. |
| 2015/0270160 A1 | 9/2015 | Okada |
| 2017/0062451 A1* | 3/2017 | Shingu .................. H10B 43/27 |
| 2017/0062456 A1 | 3/2017 | Sugino et al. |
| 2019/0206679 A1 | 7/2019 | Maeda et al. |
| 2019/0355741 A1 | 11/2019 | Lee et al. |

* cited by examiner

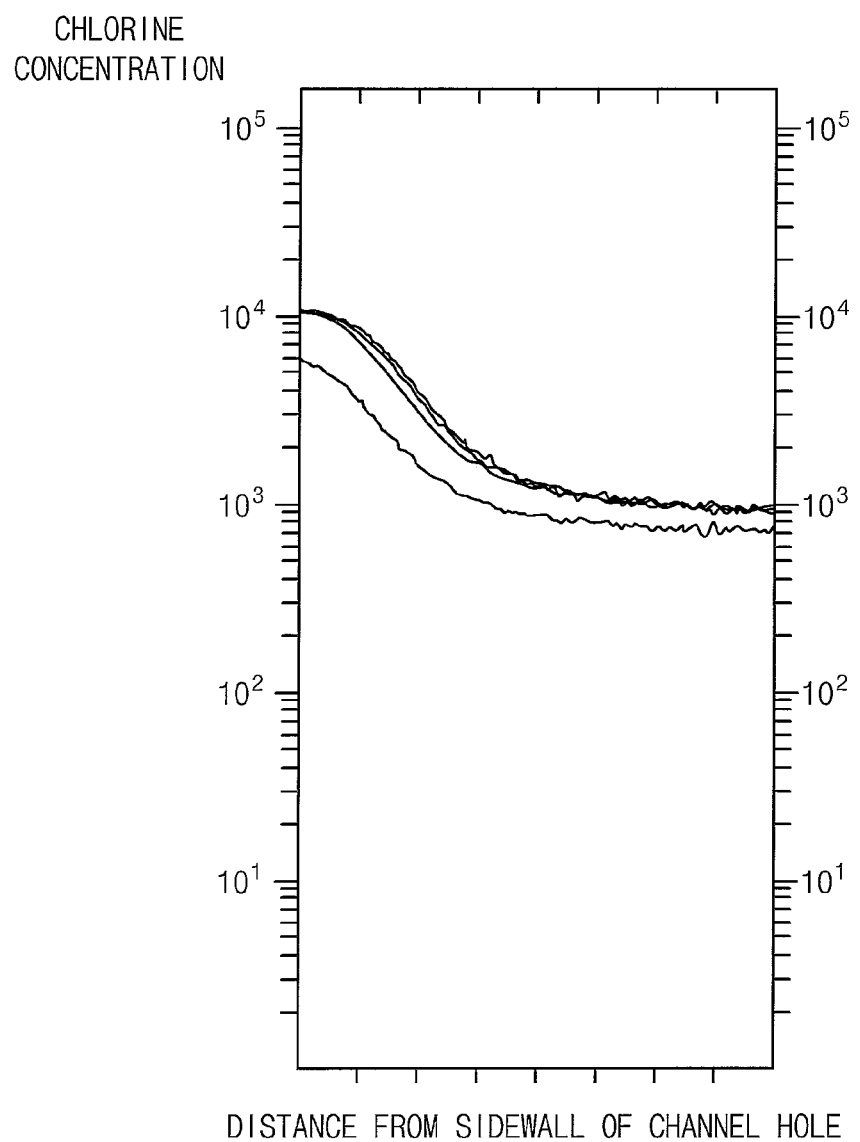

VERTICAL MEMORY DEVICES AND METHODS OF MANUFACTURING THE SAME

CROSS-REFERENCE TO RELATED APPLICATIONS

This application claims priority under 35 USC § 119 to Korean Patent Application No. 10-2020-0069614, filed on Jun. 9, 2020 in the Korean Intellectual Property Office (KIPO), the contents of which are herein incorporated by reference in their entirety.

TECHNICAL FIELD

The present disclosure relates to a memory device and, more specifically, to a vertical memory device and a method of manufacturing the same.

DISCUSSION OF THE RELATED ART

In a method of manufacturing a VNAND flash memory device, a channel hole may be formed through a mold including insulation layers and sacrificial layers alternately stacked to expose an upper surface of a substrate. A preliminary blocking layer including silicon nitride may be formed on a sidewall and a bottom of the channel hole and oxidized to form a blocking layer. If the preliminary blocking layer is oxidized by a heat oxidation process, nitrogen included within the preliminary blocking layer might not be easily removed, and thus a radical oxidation process may be performed. However, when the radical oxidation process is performed, a portion of the sacrificial layer including nitride may also be oxidized, so that a surface of the blocking layer may be uneven in a horizontal direction and the blocking layer might not be formed uniformly in a vertical direction.

SUMMARY

A method of manufacturing a vertical memory device includes alternately and repeatedly stacking an insulation layer and a sacrificial layer on a substrate to form a mold. A channel hole is formed through the mold to expose an upper surface of the substrate. A first deposition process is performed using both of a first precursor and a second precursor to form a first preliminary blocking layer on a sidewall and a bottom of the channel hole. The first precursor includes silane, and the second precursor includes silane and a halogen element. A second deposition process is performed using the first precursor to form a second preliminary blocking layer on the sidewall and the bottom of the channel hole. The first and second preliminary blocking layers form a third preliminary blocking layer. An oxidation process is performed on the third preliminary blocking layer so that the third preliminary blocking layer is transformed into a first blocking layer. A charge storage layer, a tunnel insulation layer and a channel layer are sequentially stacked on the first blocking layer. The first blocking layer, the charge storage layer, and the tunnel insulation layer form a charge storage layer structure. The sacrificial layer is removed to form a gap exposing an outer sidewall of the charge storage layer structure. A gate electrode is formed in the gap.

A method of manufacturing a vertical memory device includes forming a mold by alternately and repeatedly stacking an insulation layer and a sacrificial layer on a substrate. A channel hole is formed through the mold to expose an upper surface of the substrate. A first deposition process is performed using a first precursor to form a seed layer on a sidewall and a bottom of the channel hole. The first precursor includes silane, which includes a functional group containing nitrogen. A second deposition process is performed using both of a second precursor and a third precursor to form a first preliminary blocking layer on the sidewall and the bottom of the channel hole. The second precursor includes silane, and the third precursor includes silane and a halogen element. The second deposition process is performed at a low temperature of less than or equal to about 400° C. An oxidation process is performed on the first preliminary blocking layer so that the first preliminary blocking layer is transformed into a blocking layer. A charge storage layer, a tunnel insulation layer, and a channel layer are sequentially stacked on the blocking layer. The blocking layer, the charge storage layer and the tunnel insulation layer form a charge storage layer structure. The sacrificial layer is removed to form a gap exposing an outer sidewall of the charge storage layer structure. A gate electrode is formed in the gap.

A method of manufacturing a vertical memory device includes forming a mold by alternately and repeatedly stacking an insulation layer and a sacrificial layer on a substrate. A channel hole is formed through the mold to expose an upper surface of the substrate. A first deposition process is formed using a first precursor to form a seed layer on a sidewall and a bottom of the channel hole. The first precursor includes silane having a functional group containing nitrogen. A second deposition process is performed using both of a second precursor and a third precursor to form a first preliminary blocking layer on the sidewall and the bottom of the channel hole. The second precursor includes silane, and the third precursor includes silane and a halogen element. A third deposition process is performed using the second precursor to form a second preliminary blocking layer on the sidewall and the bottom of the channel hole. The first and second preliminary blocking layers form a third preliminary blocking layer. An oxidation process is performed on the third preliminary blocking layer so that the third preliminary blocking layer is transformed into a first blocking layer. A charge storage layer, a tunnel insulation layer, and a channel layer are sequentially stacked on the first blocking layer, and the first blocking layer, the charge storage layer and the tunnel insulation layer form a charge storage layer structure. The sacrificial layer is removed to form a gap exposing an outer sidewall of the charge storage layer structure. A gate electrode is formed in the gap.

A vertical memory device includes a channel, a charge storage structure, and gate electrodes. The channel is formed on a substrate and extends in a vertical direction substantially perpendicular to an upper surface of the substrate. The charge storage structure is formed on an outer sidewall of the channel and includes a tunnel insulation pattern, a charge storage pattern, and a first blocking pattern sequentially stacked in a horizontal direction substantially parallel to the upper surface of the substrate. The gate electrodes are spaced apart from each other in the vertical direction on the substrate. Each of the gate electrodes surrounds the charge storage structure. The first blocking pattern includes silicon oxide containing a halogen element. A concentration of the halogen element included in the first blocking pattern gradually decreases from an outer sidewall facing a corresponding one of the gate electrodes toward an inner sidewall facing the charge storage pattern.

A vertical memory device includes a channel, a charge storage structure, and gate electrodes. The channel is formed on a substrate and extends in a vertical direction substantially perpendicular to an upper surface of the substrate. The charge storage structure is formed on an outer sidewall of the channel and includes a tunnel insulation pattern, a charge storage pattern, and a first blocking pattern sequentially stacked in a horizontal direction substantially parallel to the upper surface of the substrate. The first blocking pattern includes a halogen element. The gate electrodes are spaced apart from each other in the vertical direction on the substrate. Each of the gate electrodes surrounds the charge storage structure. A thickness in the horizontal direction of the first blocking pattern is substantially uniform in the vertical direction, such that both of outer and inner sidewalls of the first blocking pattern are substantially flat (e.g. planar). A concentration of the halogen element at the inner sidewall of the first blocking pattern is less than a concentration of the halogen element at the outer sidewall of the first blocking pattern.

A vertical memory device includes channels, a channel connection pattern, a charge storage structure, gate electrodes, division patterns, and bit lines. The channels are formed on a substrate. Each of the channels extends in a first direction substantially perpendicular to an upper surface of the substrate. The channel connection pattern is formed on the substrate and contacts the channels. The charge storage structure is formed on an outer sidewall of each of the channels on the channel connection pattern and includes a tunnel insulation pattern, a charge storage pattern, and a first blocking pattern sequentially stacked in a horizontal direction substantially parallel to the upper surface of the substrate. The gate electrodes are spaced apart from each other in the first direction on the channel connection pattern. Each of the gate electrodes surrounds the charge storage structure. The division patterns are formed on the substrate. Each of the division patterns penetrates through the gate electrodes and extends in a second direction substantially parallel to the upper surface of the substrate to separate each of the gate electrodes in a third direction substantially parallel to the upper surface of the substrate and crossing the second direction. The bit lines are spaced apart from each other in the second direction. Each of the bit lines extends in the third direction on the channels. The bit lines are electrically connected to the channels. The first blocking pattern includes silicon oxide containing a halogen element. A concentration of the halogen element included in the first blocking pattern gradually decrease from an outer sidewall facing a corresponding one of the gate electrodes toward an inner sidewall facing the charge storage pattern.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 14 is a graph illustrating a concentration of chlorine remaining in the first blocking pattern according to a distance from the sidewall of the channel hole when the second deposition process for forming the first preliminary blocking layer is performed using DCS as the third precursor.

DETAILED DESCRIPTION

The above and other aspects and features of the vertical memory devices and the methods of manufacturing the same in accordance with exemplary embodiments of the present disclosure will become readily understood from detail descriptions that follow, with reference to the accompanying drawings. Hereinafter in the specifications, a direction substantially perpendicular to an upper surface of a substrate may be referred to as a first direction, and two directions substantially parallel to the upper surface of the substrate and crossing each other may be referred to as second and third directions, respectively. In exemplary embodiments of the present disclosure, the second and third directions may be substantially perpendicular to each other.

FIGS. 1 to 13 are cross-sectional views illustrating a method of manufacturing a vertical memory device in accordance with exemplary embodiments of the present disclosure.

Figure 1:
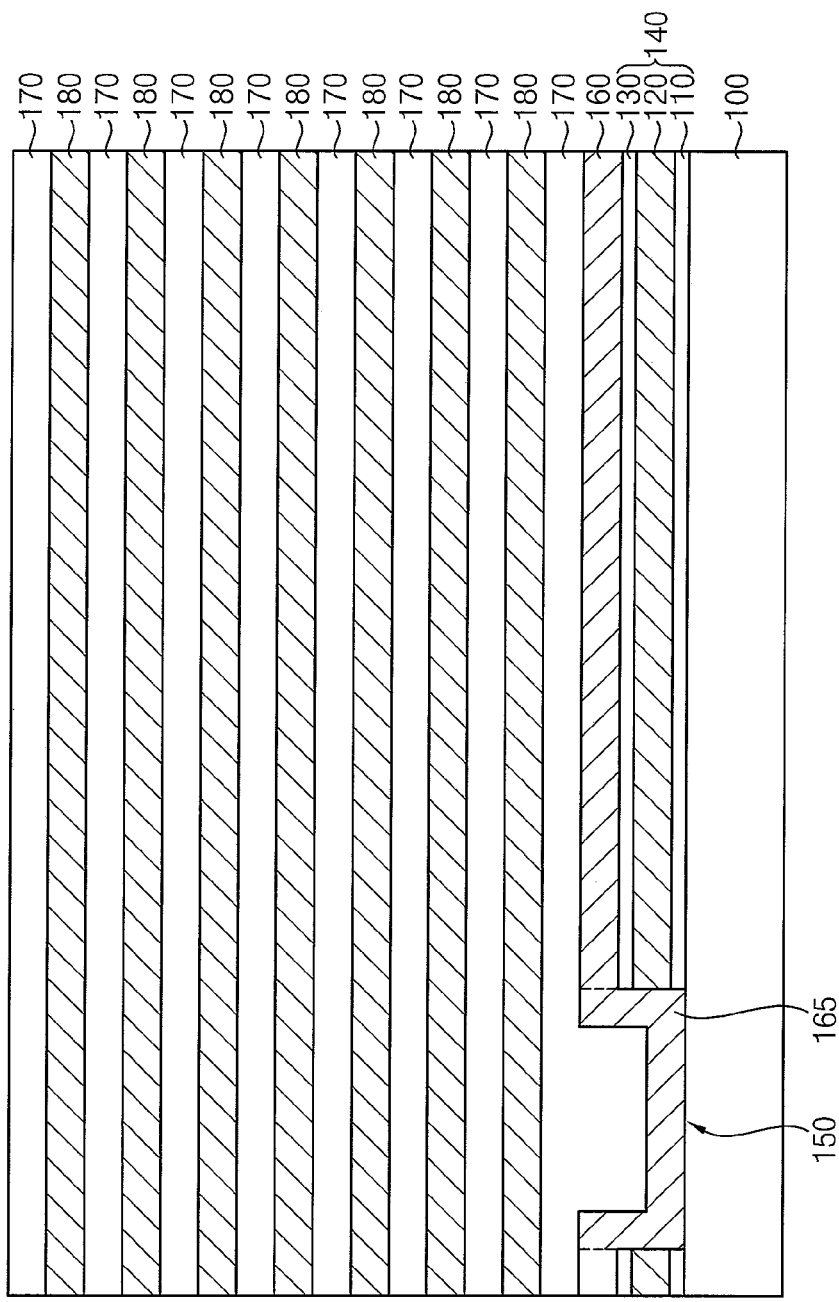
FIGS. 1 to 13 are cross-sectional views illustrating a method of manufacturing a vertical memory device in accordance with exemplary embodiments of the present disclosure.

Referring to FIG. 1, a sacrificial layer structure 140 may be formed on a substrate 100. The sacrificial layer structure 140 may be partially removed to form a first opening 150 exposing an upper surface of the substrate 100. A support layer 160 may be formed on the substrate 100 and the sacrificial layer structure 140 to at least partially fill the first opening 150.

The substrate 100 may include silicon, germanium, silicon-germanium or a III-V compound such as GaP, GaAs, GaSb, etc. In some exemplary embodiments of the present disclosure, the substrate 100 may be a silicon-on-insulator (SOI) substrate or a germanium-on-insulator (GOI) substrate. For example, n-type impurities may be doped into the substrate 100.

The sacrificial layer structure 140 may include first to third sacrificial layers 110, 120, and 130 sequentially stacked in the first direction on the substrate 100. Each of the first and third sacrificial layers 110 and 130 may include an oxide, e.g., silicon oxide, and the second sacrificial layer 120 may include a nitride, e.g., silicon nitride.

The support layer 160 may include a material having an etching selectivity with respect to the first to third sacrificial layers 110, 120, and 130, e.g., doped or undoped polysilicon. In some exemplary embodiments of the present disclosure, the support layer 160 may be formed by depositing doped or undoped amorphous silicon, and by performing a heat treatment or by being crystallized through heat generated during deposition processes for other structures to include doped or undoped polysilicon.

The support layer 160 may have a uniform thickness, and thus a first recess may be formed on a portion of the support layer 160 in the first opening 150. Hereinafter, the portion of the support layer 160 in the first opening 150 may be referred to as a support pattern 165.

An insulation layer 170 may be formed on the support layer 160. The insulation layer 170 may fill a portion of the first opening 150 that is not already filled by the support pattern 165. An upper surface of the insulation layer 170 may be planarized by a planarization process. The planarization process may include a chemical mechanical polishing (CMP) process and/or an etch back process. The planarized insulation layer 170 may be referred to herein as a first insulation layer 170.

A fourth sacrificial layer 180 and the insulation layer 170 may be alternately and repeatedly formed on the first insulation layer 170, and thus a mold layer may be formed on the substrate 100. The insulation layer 170 may include an oxide, e.g., silicon oxide, and the fourth sacrificial layer 180 may include a material having an etching selectivity with respect to the insulation layer 170, e.g., a nitride such as silicon nitride.

A patterning process using a photoresist pattern as an etching mask may be performed on the insulation layer 170 and the fourth sacrificial layer 180, and a trimming process for reducing an area of the photoresist pattern may also be performed. The patterning process and the trimming process may be alternately and repeatedly performed to form a mold having a plurality of step layers each including the fourth sacrificial layer 180 and the insulation layer 170 sequentially stacked on the substrate 100.

Figure 2:
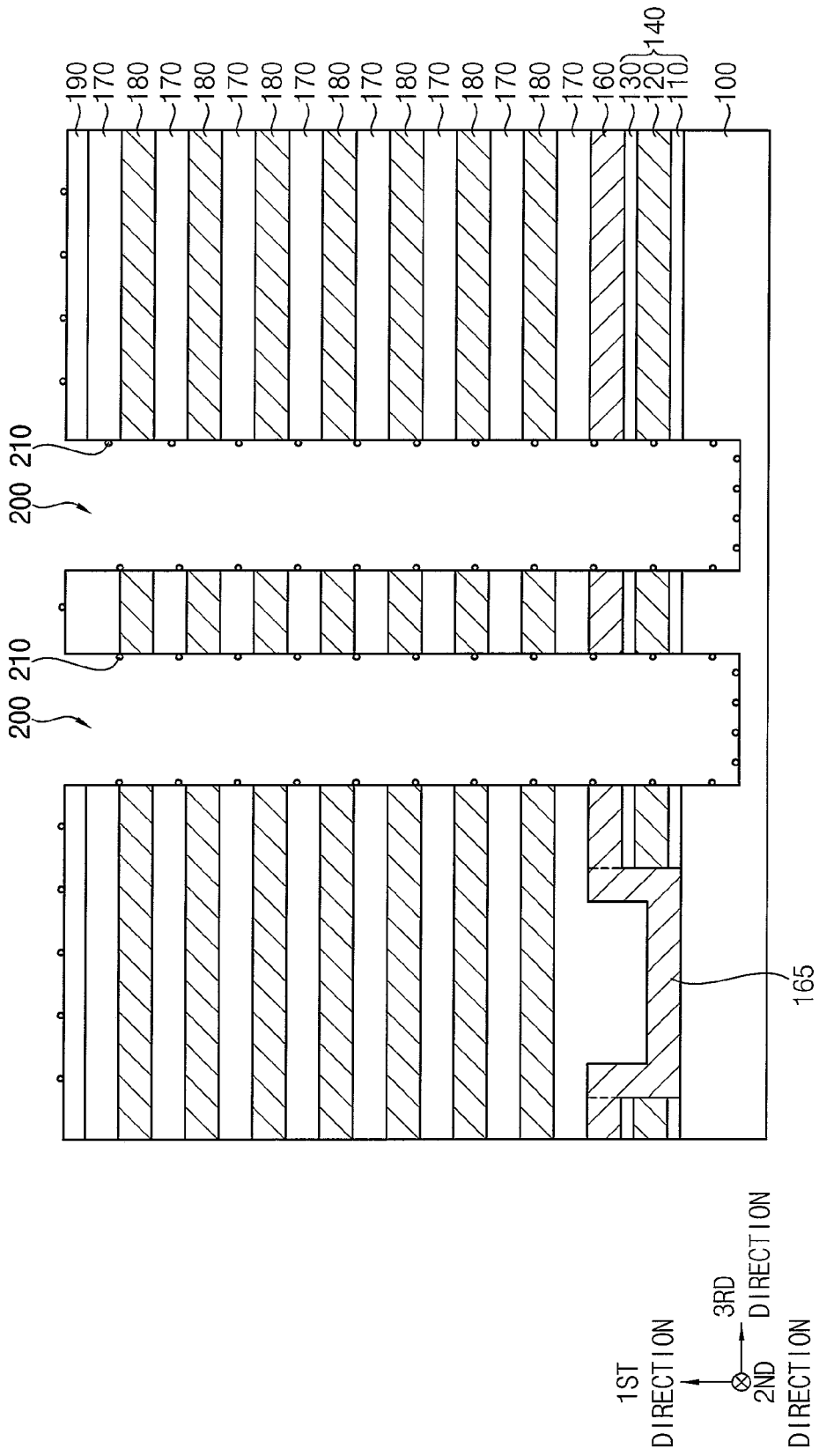

Referring to FIG. 2, a first insulating interlayer 190 may be formed on the substrate 100 to cover the mold, and a channel hole 200 may be formed through the first insulating interlayer 190 and the mold to expose an upper surface of the substrate 100 by, e.g., a dry etching process.

In exemplary embodiments of the present disclosure, the dry etching process may be performed until the upper surface of the substrate 100 may be exposed, and an upper portion of the substrate 100 may be further removed in the dry etching process. In exemplary embodiments of the present disclosure, a plurality of channel holes 200 may be formed in each of the second and third directions, and thus a channel hole array may be defined.

A seed layer 210 including silicon may be formed on a sidewall and a bottom of the channel hole 200, and a portion of the seed layer 210 may also be formed on an upper surface of the first insulating interlayer 190.

In exemplary embodiments of the present disclosure, the seed layer 210 may be formed by a first deposition process using a first precursor that may include silane having a functional group containing nitrogen. For example, the first precursor may include diisopropylamino silane (DIPAS), dipropylamino silane (DPAS), dimethylamine silane (DMAS), diethylamino silane (DEAS), di(t-butylamino) silane (DTBAS) etc. Thus, the seed layer 210 that may be formed by the first deposition process may include nitrogen together with silicon.

Figure 3:
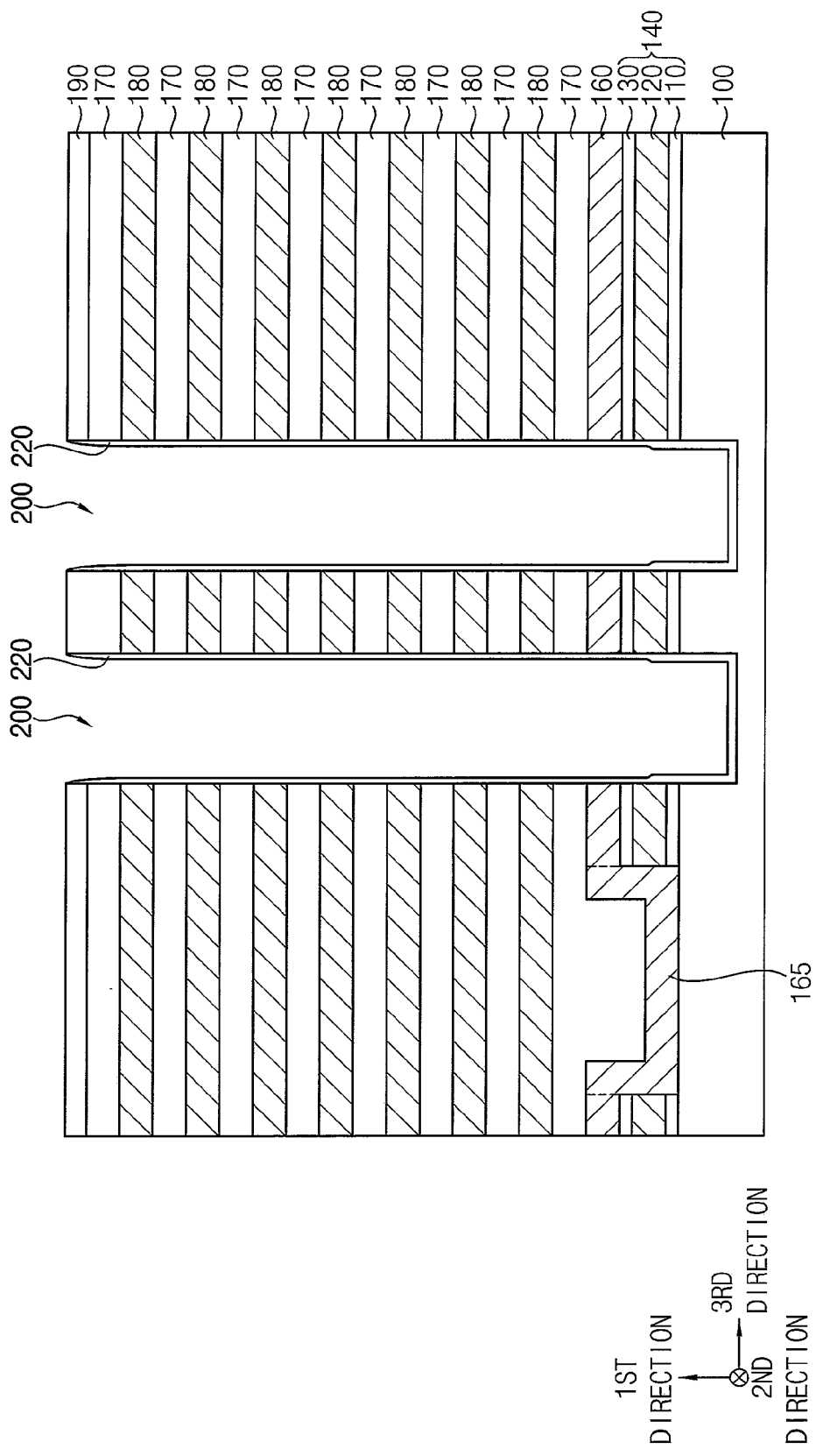

Referring to FIG. 3, a first preliminary blocking layer 220 including silicon may be formed on the sidewall and the bottom of the channel hole 200.

In exemplary embodiments of the present disclosure, the first preliminary blocking layer 220 may be formed by a second deposition process using a second precursor and a third precursor each of which may include silicon. The second precursor may include, e.g., mono-silane (MS), and the third precursor may include silane and a halogen element, e.g., fluorine, chlorine, bromine, iodine, etc. Particularly, the third precursor may include e.g., difluorosilane ($SiH_2F_2$), dichlorosilane (DCS) ($SiH_2Cl_2$), dibromosilane ($SiH_2Br_2$), diiodosilane ($SiH_2I_2$), etc.

During the second deposition process, the halogen element may be pyrolized from the third precursor, and the decomposed halogen element may remove the functional group including nitrogen on a surface of the seed layer 210 and a portion, mainly an upper portion of the first preliminary blocking layer 220. Thus, a lower portion of the first preliminary blocking layer 220 may be thicker than an upper portion thereof, and the first preliminary blocking layer 220 might not be formed on the upper surface of the first insulating interlayer 190.

Generally, if the second deposition process is performed using only the second precursor without the third precursor, a thickness of a layer deposited at an upper portion of the channel hole 200 may increase, and thus an entrance of the channel hole 200 may narrow so that the layer might not be formed at a lower portion of the channel hole 200. However, in exemplary embodiments of the present disclosure, the second deposition process may be performed using the third precursor together with the second precursor, and thus a thickness of the first preliminary blocking layer 220 deposited at the upper portion of the channel hole 200 may decrease due to the etching operation of the halogen element included in the third precursor, and the first preliminary blocking layer 220 may be easily deposited to the lower portion of the channel hole 200. Further, a thickness of a portion of the first preliminary blocking layer 220 at the lower portion of the channel hole 200 may be greater than a thickness of a portion of the first preliminary blocking layer 220 at the upper portion of the channel hole 200.

In exemplary embodiments of the present disclosure, the second deposition process may be performed under a hydrogen atmosphere and at a low temperature of less than or equal to about 400° C. As mentioned above, the seed layer 210 formed by the first deposition process may include nitrogen, and hydrogen may serve as catalyst for pyrolizing the halogen element included in the third precursor even at a low temperature on the surface of the seed layer 210 including nitrogen during the second deposition process. Thus, the first preliminary blocking layer 220 may be deposited at the upper portion of the channel hole 200 and the lower portion thereof as well even at a low temperature under a hydrogen atmosphere.

A purge process may be performed on the substrate 100 having the first preliminary blocking layer 220 thereon.

Figure 4:
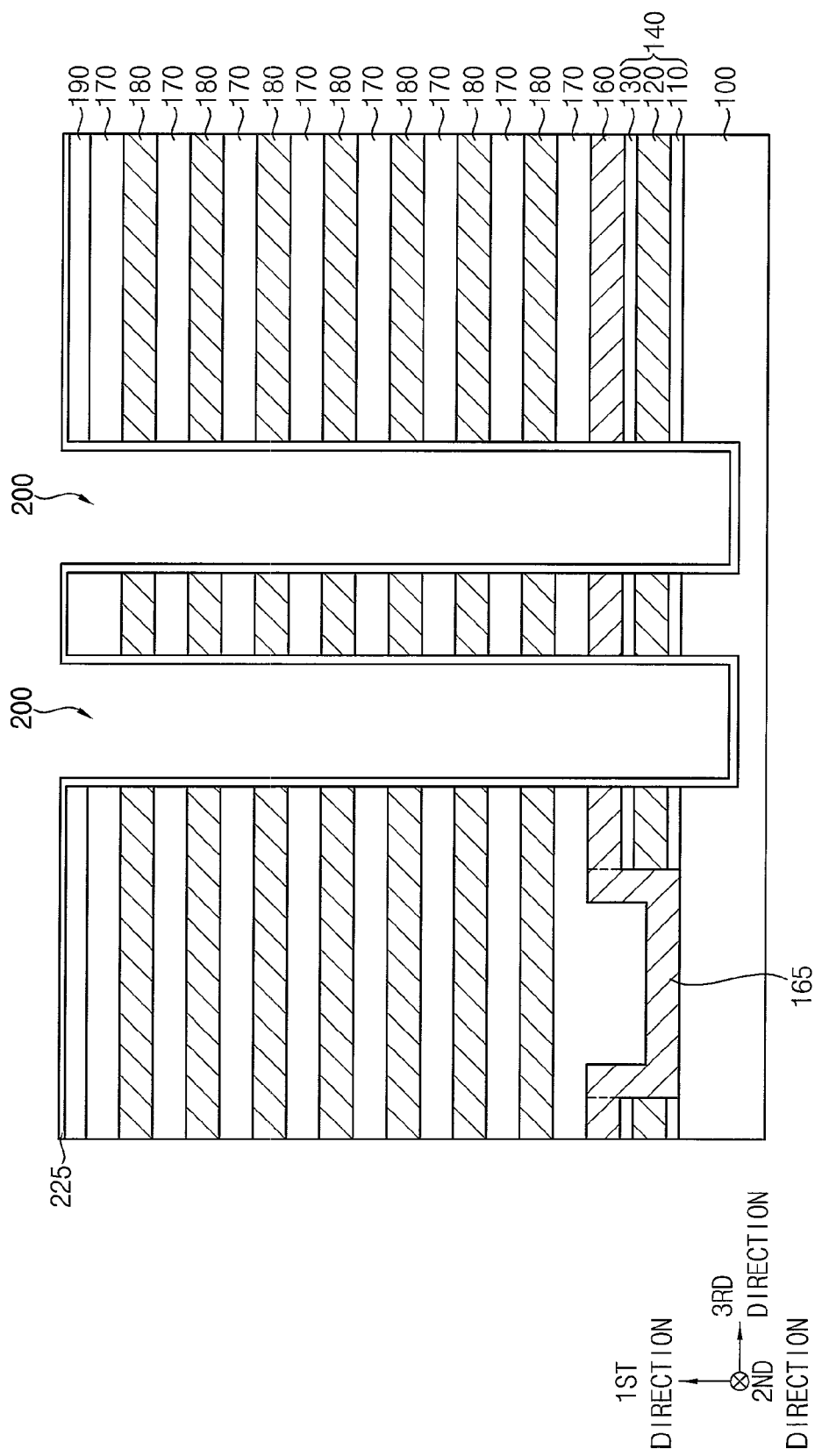

Referring to FIG. 4, a third deposition process using only the second precursor may be performed to form a second blocking layer on the first preliminary blocking layer 220 and the first insulating interlayer 190. The second preliminary blocking layer together with the first preliminary blocking layer 220 may form a third preliminary blocking layer 225. The third preliminary blocking layer 225 may include nitrogen-free polysilicon.

The third deposition process may be performed using only the second precursor, and thus a thickness of a portion of the second preliminary blocking layer at the upper portion of the channel hole 200 may be greater than a thickness of a portion of the second preliminary blocking layer at the lower portion thereof. Since the portion of the first preliminary blocking layer 220 at the lower portion of the channel hole 200 is thicker than the portion of the first preliminary blocking layer 220 at the upper portion of the channel hole 200, the third preliminary blocking layer 225 including the first preliminary blocking layer 220 and the second preliminary blocking layer formed by the third deposition process may have a uniform thickness in the channel hole 200.

Figure 5:
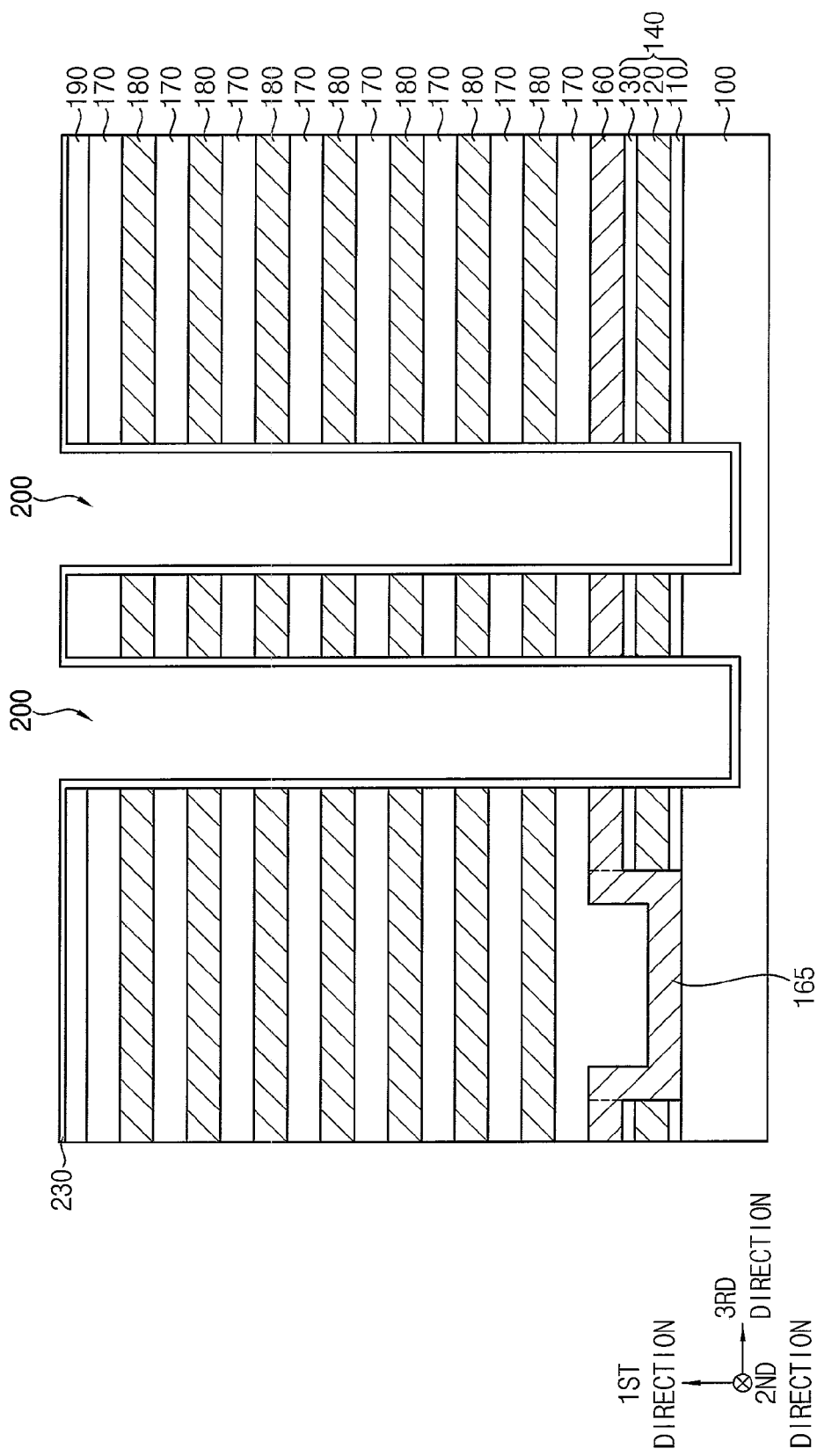

Referring to FIG. 5, an oxidation process may be performed on the third preliminary blocking layer 225, and thus the third preliminary blocking layer 225 may be transformed into a first blocking layer 230 including silicon oxide.

In exemplary embodiments of the present disclosure, the oxidation process may be performed by a heat oxidation process. Alternatively, the oxidation process may be performed by a radical oxidation process.

In exemplary embodiments of the present disclosure, the oxidation process may include a cleaning oxidation process, a dry oxidation process, a wet oxidation process, etc.

The third preliminary blocking layer 225 may include polysilicon and may cover the sidewall of the channel hole 200, and thus, during the oxidation process, a portion of the fourth sacrificial layer 180 including a nitride and being adjacent to the channel hole 200 might not be oxidized.

Figure 6:
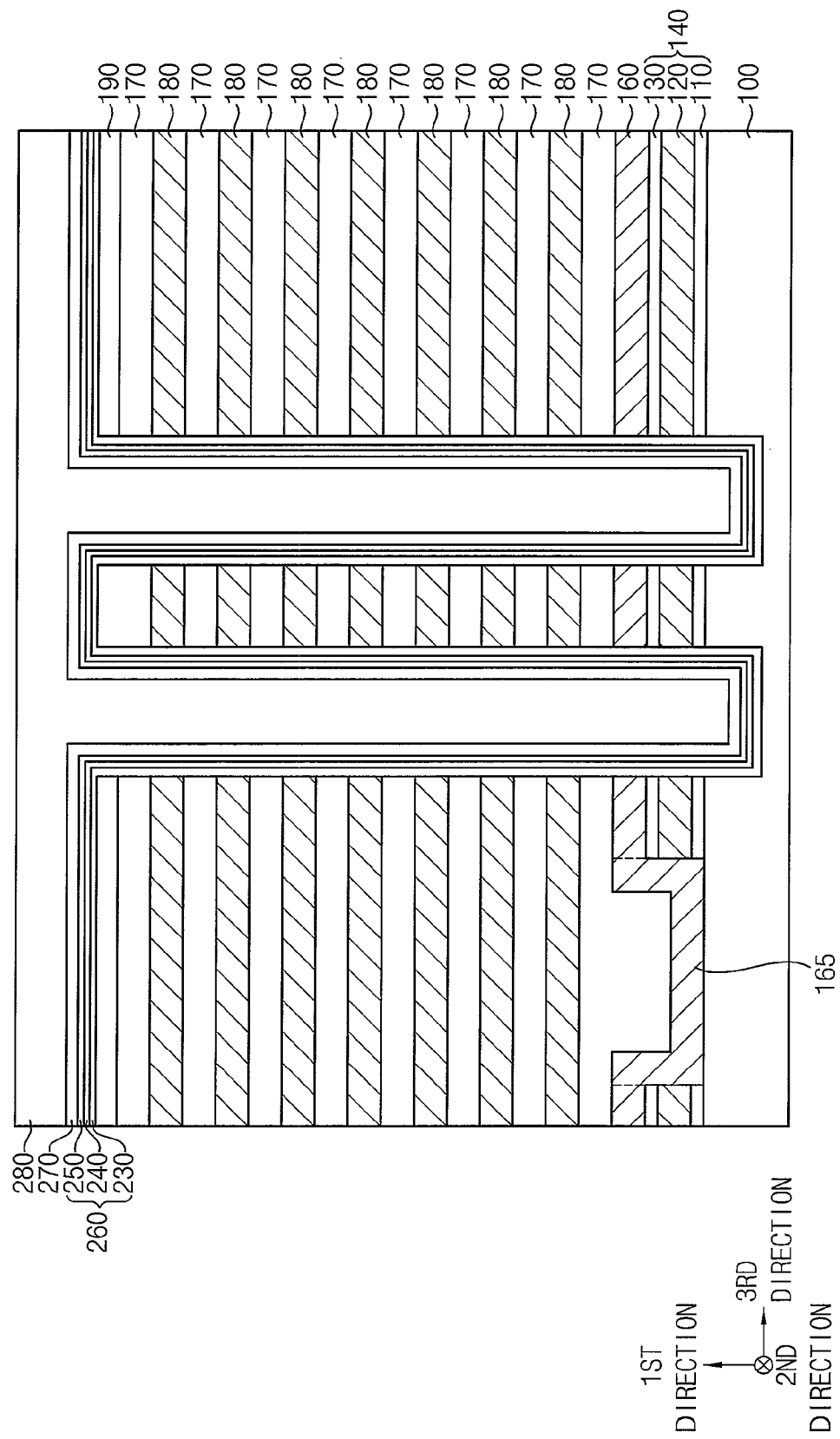

Referring to FIG. 6, a charge storage layer 240, a tunnel insulation layer 250 and a channel layer 270 may be sequentially formed on the first blocking layer 230, and a filling layer 280 may be formed on the channel layer 270 to fill the channel hole 200. The first blocking layer 230, the charge storage layer 240 and the tunnel insulation layer 250 sequentially stacked on the sidewall and the bottom of the channel hole 200 may form a charge storage layer structure 260.

The charge storage layer 240 may include a nitride, e.g., silicon nitride. The tunnel insulation layer 250 may include an oxide, e.g., silicon oxide. The channel layer 270 may include, e.g., polysilicon. The filling layer 280 may include an oxide, e.g., silicon oxide.

Figure 7:
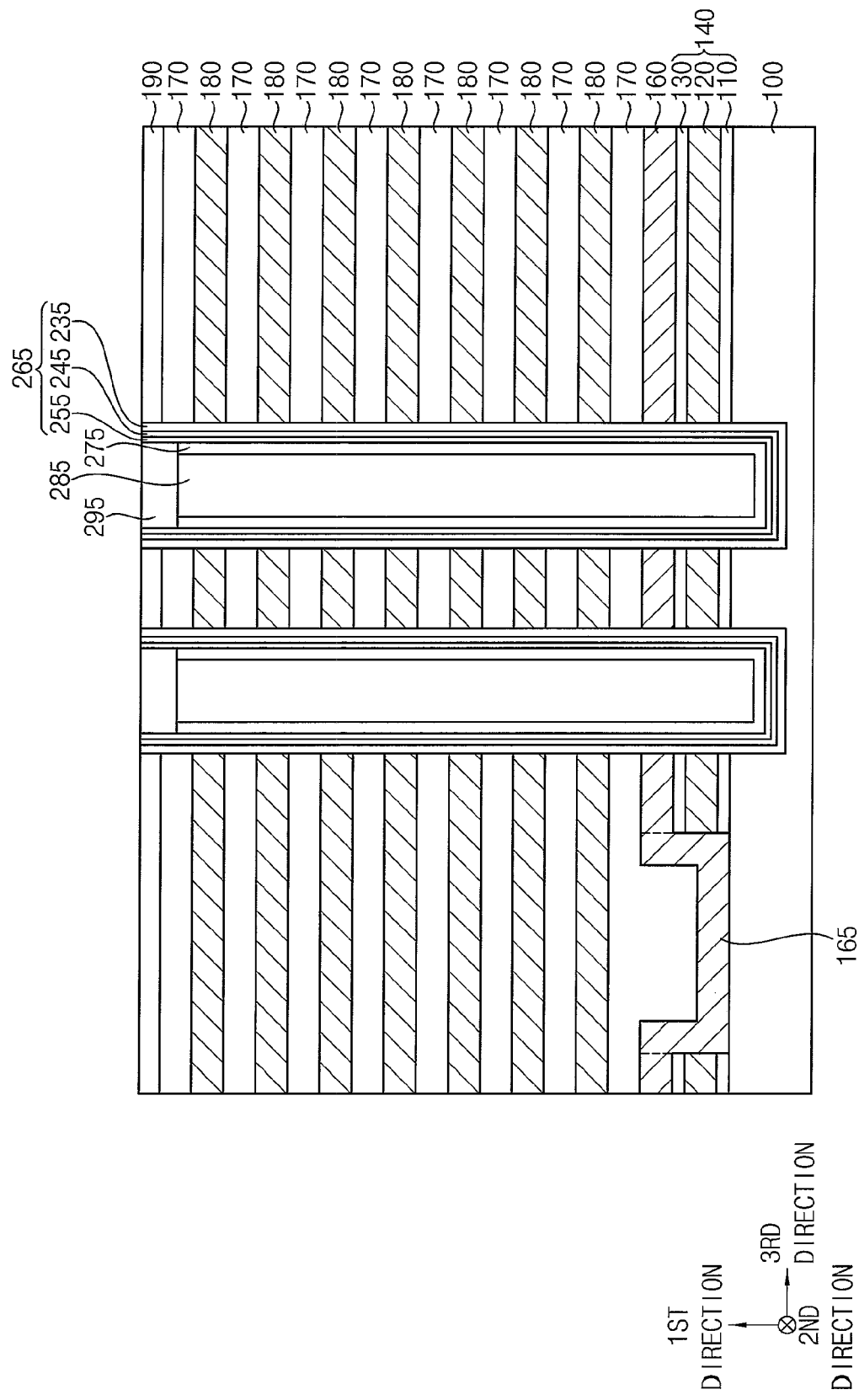

Referring to FIG. 7, the filling layer 280, the channel layer 270, and the charge storage layer structure 260 may be planarized until the upper surface of the first insulating interlayer 190 is exposed to form a filling pattern 285, a channel 275, and a charge storage structure 265, respectively, in the channel hole 200. The charge storage structure 265 may include a first blocking pattern 235, a charge storage pattern 245 and a tunnel insulation pattern 255 sequentially stacked on the sidewall and the bottom of the channel hole 200.

In exemplary embodiments of the present disclosure, the filling pattern 285 may have a pillar shape extending in the first direction, and each of the channel 275 and the charge storage structure 265 may have a cup-like shape.

As the channel hole 200 in which the channel 275 is formed may define the channel hole array, the channel 275 in the channel hole 200 may also define a channel array.

Upper portions of the filling pattern 285 and the channel 275 may be removed to form a second recess, a pad layer may be formed on the first insulating interlayer 190 to fill the second recess, and the pad layer may be planarized until the upper surface of the first insulating interlayer 190 may be exposed to form a pad 295.

Figure 8:
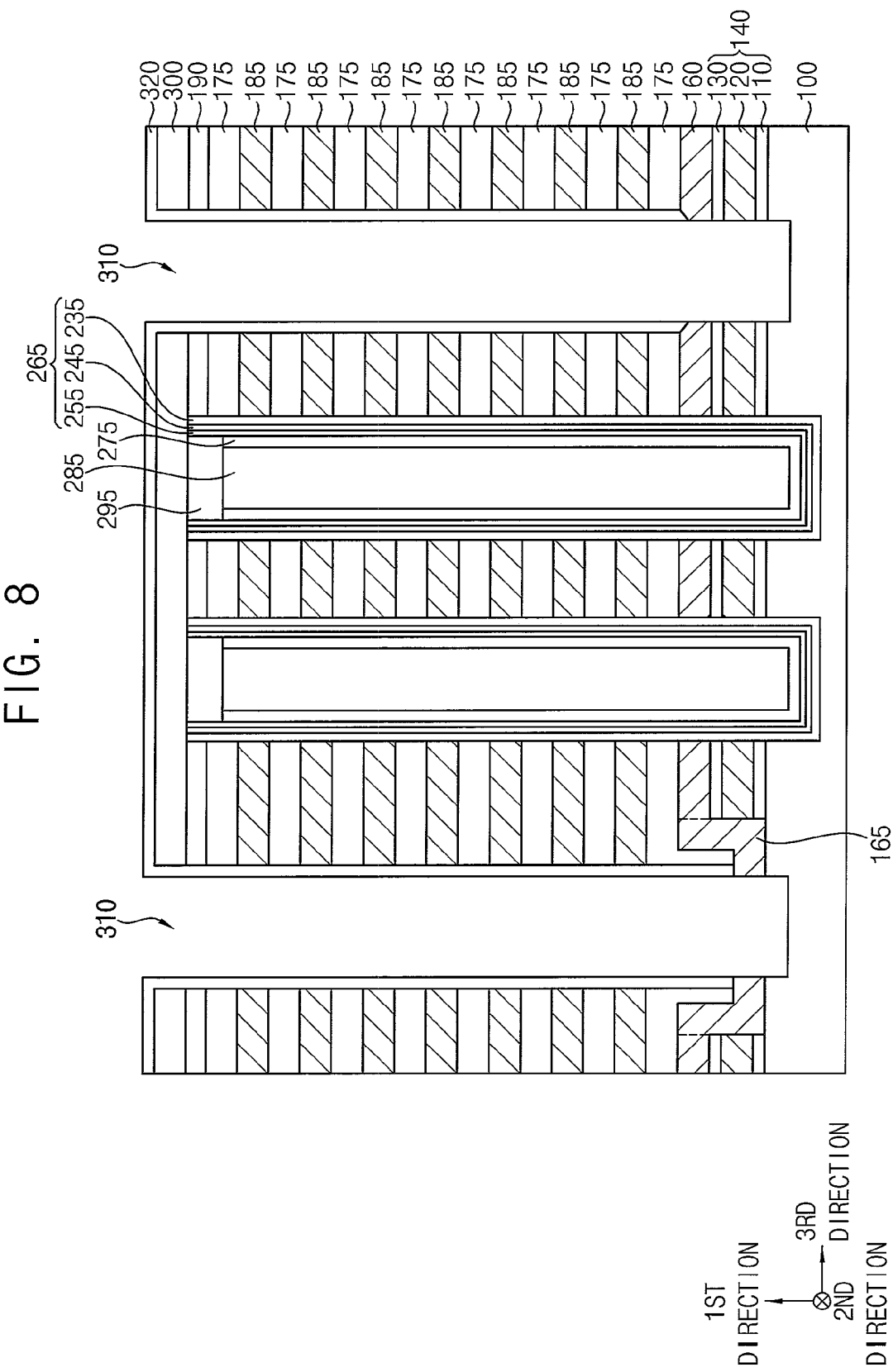

Referring to FIG. 8, a second insulating interlayer 300 may be formed on the first insulating interlayer 190 and the pad 295. A second opening 310 may be formed through the first and second insulating interlayers 190 and 300 and the mold by a dry etching process.

In exemplary embodiments of the present disclosure, the dry etching process may be performed until an upper surface of the support layer 160 or an upper surface of the support pattern 165 may be exposed, and an upper portion of the support layer 160 or an upper portion of the support pattern 165 may also be removed during the dry etching process. As the second opening 310 is formed, the insulation layers 170 and the fourth sacrificial layers 180 of the mold (e.g. as seen in FIG. 7) may be exposed to create the insulation patterns 175 and the sacrificial patterns 185, as discussed below.

In exemplary embodiments of the present disclosure, the second opening 310 may extend in the second direction, and a plurality of second openings 310 may be formed in the third direction. As the second opening 310 is formed, the insulation layer 170 may be divided into insulation patterns 175, each of which may extend in the second direction, and the fourth sacrificial layer 180 may be divided into fourth sacrificial patterns 185, each of which may extend in the second direction.

A spacer layer may be formed on a sidewall of the second opening 310, the exposed upper surfaces of the second opening 310, an upper surface of the second insulating interlayer 300, and may be anisotropically etched to remove portions of the spacer layer on the upper surfaces of the support layer 160 and the support pattern 165, so that a spacer 320 may be formed and that the upper surfaces of the support layer 160 and the support pattern 165 may be exposed again.

In exemplary embodiments of the present disclosure, the spacer 320 may include, e.g., undoped amorphous silicon or undoped polysilicon. When the spacer 320 includes undoped amorphous silicon, the undoped amorphous silicon may be crystallized during subsequent deposition processes.

Portions of the support layer 160 and the support pattern 165 not covered by the spacer 320 and a portion of the sacrificial layer structure 140 thereunder may be removed to enlarge the second opening 310 downwardly. Thus, the second opening 310 may expose an upper surface of the substrate 100, and further extend through an upper portion of the substrate 100.

When the sacrificial layer structure 140 is partially removed, the sidewall of the second opening 310 may be covered by the spacer 320, and the spacer 320 includes a material different from that of the sacrificial layer structure 140 so that the insulation patterns 175 and the fourth sacrificial patterns 185 included in the mold might not be removed.

Figure 9:
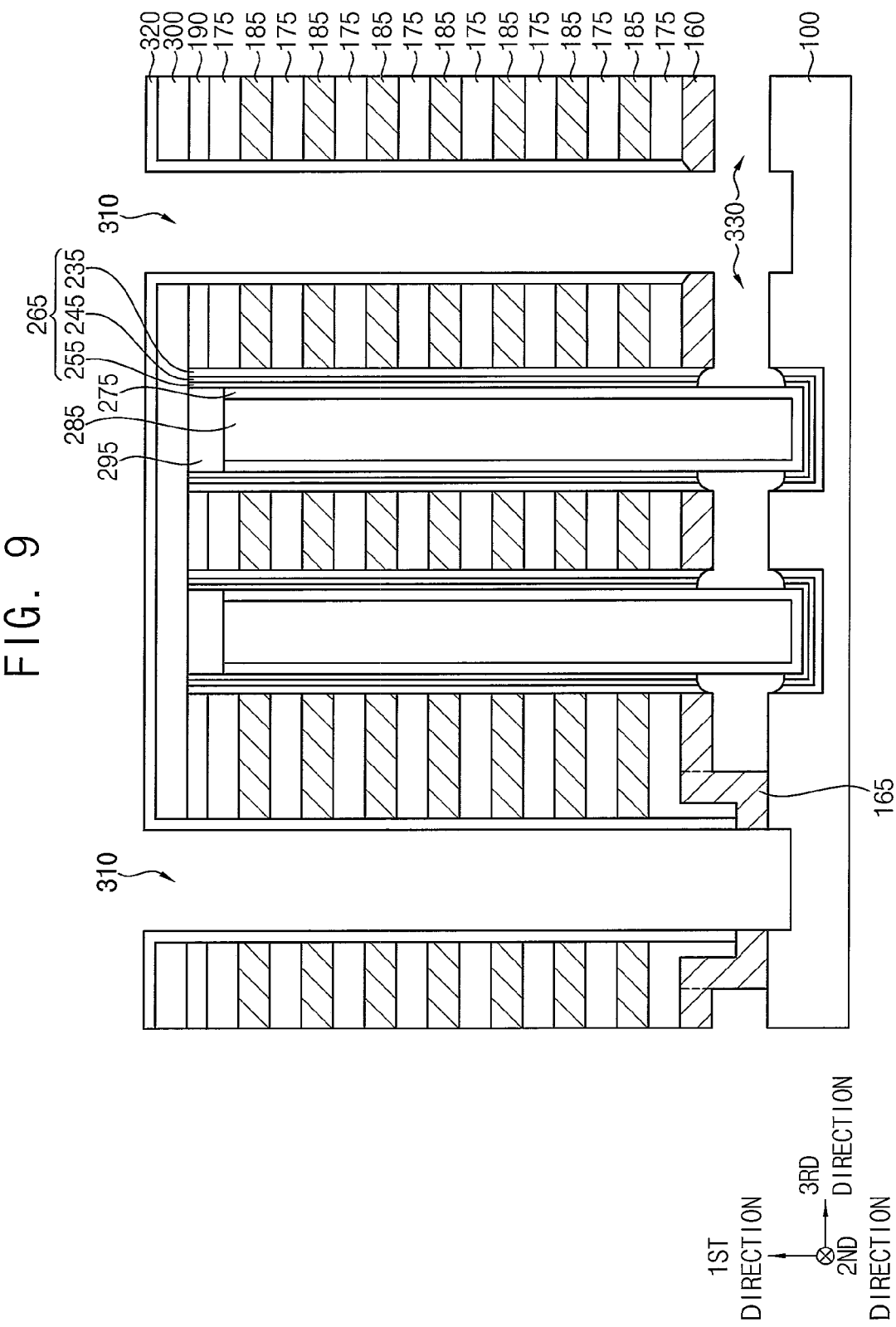

Referring to FIG. 9, the sacrificial layer structure 140 exposed by the second opening 310 may be removed to form a first gap 330 exposing a lower outer sidewall of the charge storage structure 265. A portion of the charge storage structure 265 exposed by the first gap 330 may be further removed to expose a lower outer sidewall of the channel 275.

The sacrificial layer structure 140 and the charge storage structure 265 may be removed by a wet etching process using, e.g., hydrofluoric acid or phosphoric acid. When the first gap 330 is formed, the support layer 160, the support pattern 165, the channel 275 and the filling pattern 285 might not be removed so that the mold might not collapse.

As the first gap 330 is formed, the charge storage structure 265 may be divided into an upper portion extending through the mold to cover almost an entire outer sidewall of the channel 275, and a lower portion covering a bottom surface of the channel 275 on the substrate 100.

Figure 10:
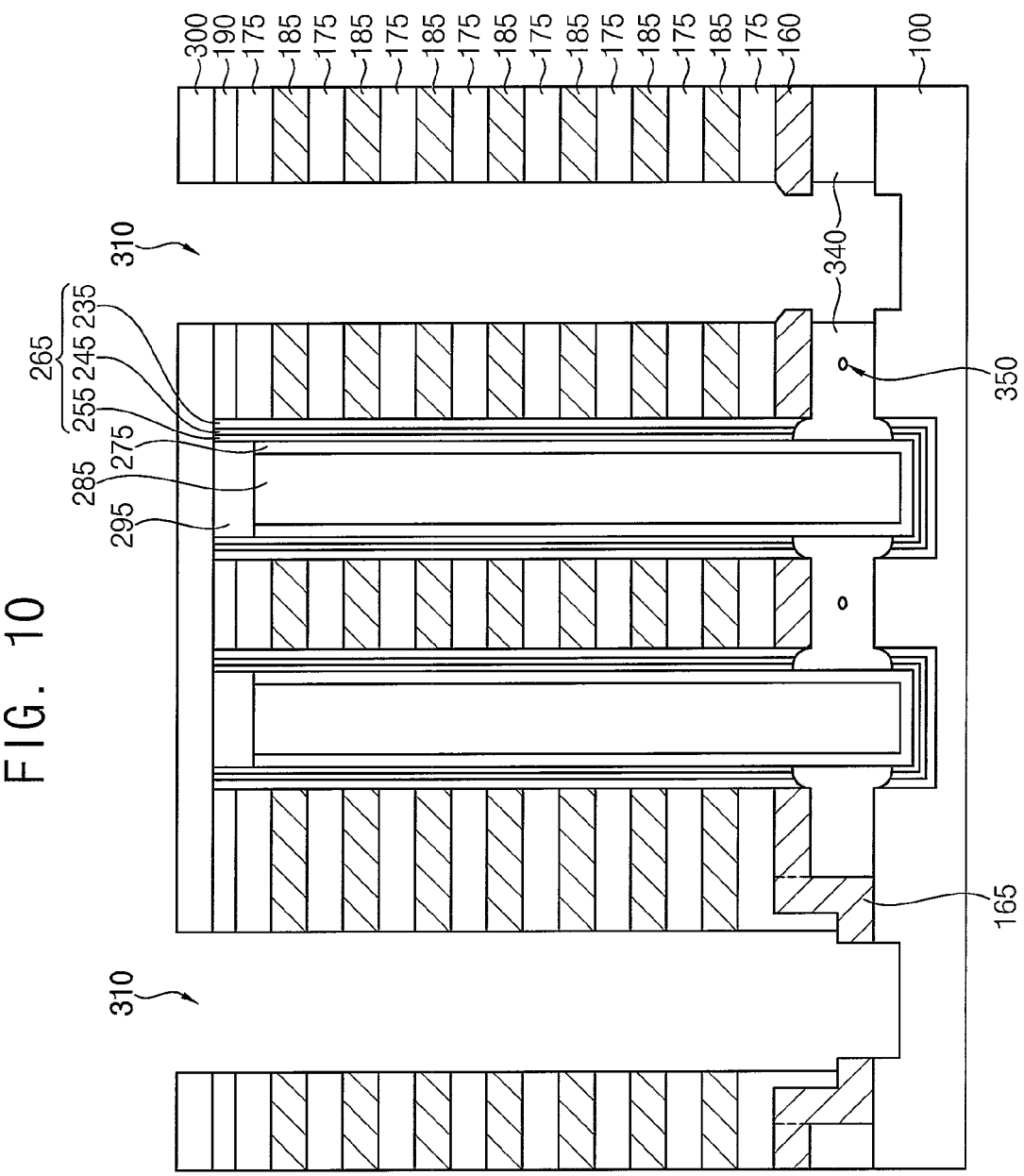

Referring to FIG. 10, after removing the spacer 320, a channel connection pattern 340 may be formed to fill the first gap 330.

The channel connection pattern 340 may be formed by forming a channel connection layer on the substrate 100 and the second insulating interlayer 300 to fill the second opening 310 and the first gap 330, and performing an etch back process on the channel connection layer. The channel connection layer may include, e.g., amorphous silicon doped with n-type impurities, and may be crystallized by heat generated by subsequent deposition processes so as to include polysilicon doped with n-type impurities. As the channel connection pattern 340 is formed, the channels 275 between neighboring ones of the second openings 310 in the third direction may be connected with each other to form a channel block.

An air gap 350 may be formed in the channel connection pattern 340.

Figure 11:
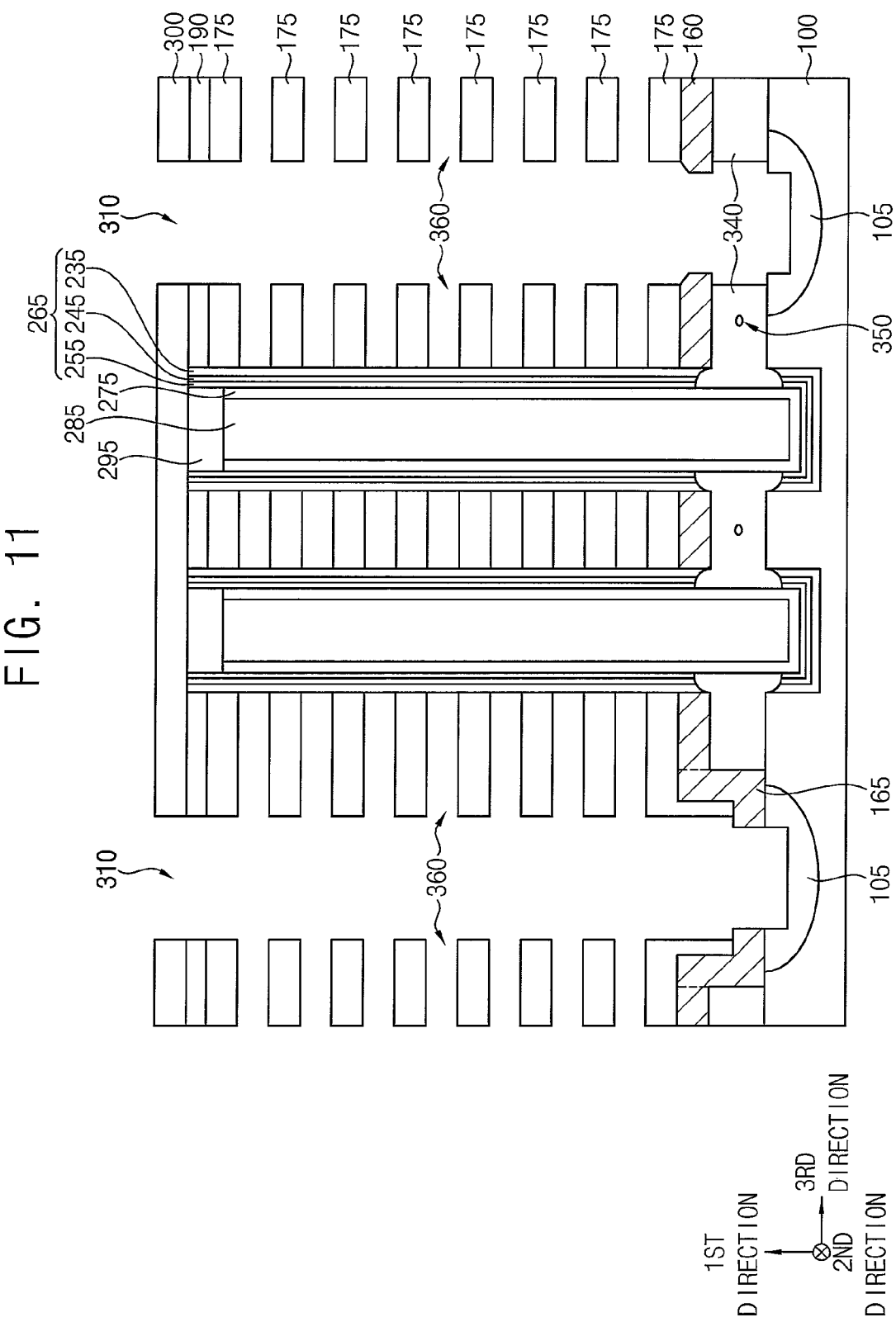

Referring to FIG. 11, for example, n-type impurities may be implanted into an upper portion of the substrate 100 exposed by the second opening 310 to form an impurity region 105.

The fourth sacrificial patterns 185 may be removed to form a second gap 360 exposing an outer sidewall of the charge storage structure 265. The fourth sacrificial patterns 185 may be removed by a wet etching process using e.g., phosphoric acid or hydrofluoric acid.

Figure 12:
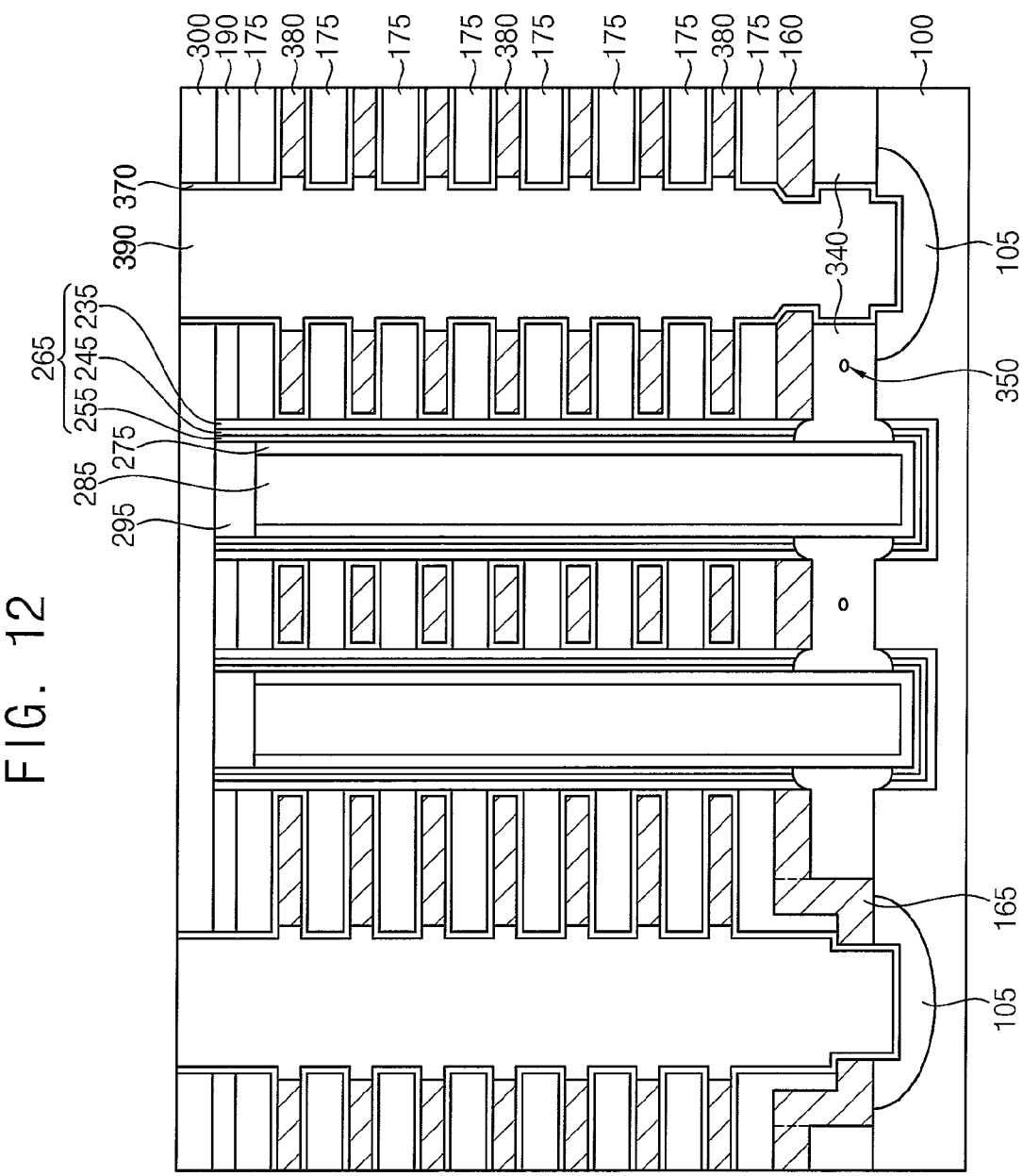

Referring to FIG. 12, a second blocking layer may be formed on the exposed outer sidewall of the charge storage structure 265, inner walls of the second gaps 360, surfaces of the insulation patterns 175, sidewalls of the support layer 160 and the support pattern 165, a sidewall of the channel connection pattern 340, the upper surface of the substrate 100, and an upper surface of the second insulating interlayer 300, and a gate electrode layer may be formed on the second blocking layer. The gate electrode layer may include a gate barrier layer and a gate conductive layer sequentially stacked.

The second blocking layer may include, e.g., a metal oxide, the gate barrier layer may include a metal nitride, e.g., titanium nitride, tantalum nitride, tungsten nitride, etc., and the gate conductive layer may include a metal, e.g., tungsten, copper, etc.

The gate electrode layer may be partially removed to form a gate electrode 380 in each of the second gaps 360. In exemplary embodiments of the present disclosure, the gate electrode layer may be partially removed by a wet etching process.

In exemplary embodiments of the present disclosure, the gate electrode 380 may extend in the second direction, and a plurality of gate electrodes 380 may be formed in the first direction, which may form a gate electrode structure. Additionally, a plurality of gate electrode structures may be formed in the third direction, and may be spaced apart from each other by the second opening 310.

In exemplary embodiments of the present disclosure, each of the gate electrodes 380 included in the gate electrode structure may serve as one of a ground selection line (GSL), a word line, and a string selection line (SSL) according to its position. In an exemplary embodiment of the present disclosure, a lowermost one of the gate electrodes 380 may serve as the GSL, an uppermost one and a second one from above of the gate electrodes 380 may serve as the SSLs, respectively, and a plurality of gate electrodes 380 between the GSL and the SSL may serve as the word lines, respectively. According to an exemplary embodiment of the present disclosure, one or a plurality of gate electrodes 380 may be further formed under the GSL or over the SSL, which may serve as a gate induced drain leakage (GIDL) for body erasing using GIDL phenomenon. Some of the gate electrodes 380 serving as the word lines may be dummy word lines.

A division layer may be formed on the second blocking layer to fill the second opening 310, and the division layer and the second blocking layer may be planarized until the upper surface of the second insulating interlayer 300 is exposed. Thus, the second blocking layer may be transformed into a second blocking pattern 370, and the division layer may be transformed into a division pattern 390 filling the second opening 310 and extending in the second direction.

Figure 13:
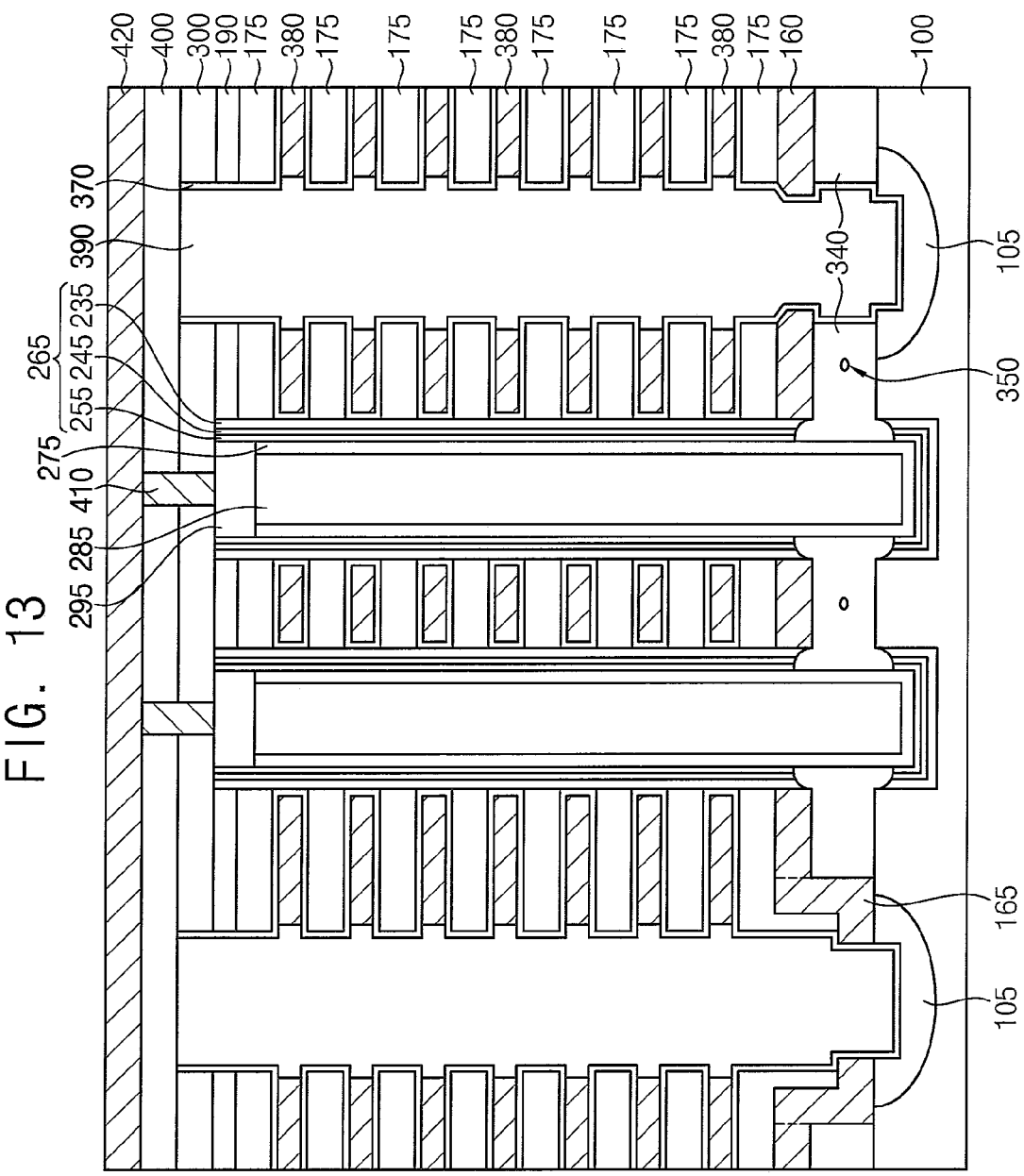

Referring to FIG. 13, a third insulating interlayer 400 may be formed on the second insulating interlayer 300, the division pattern 390 and the second blocking pattern 370, and a contact plug 410 may be formed through the second and third insulating interlayers 300 and 400 to contact an upper surface of the pad 295.

A bit line 420 may be formed on an upper surface of the contact plug 410. In exemplary embodiments of the present disclosure, the bit line 420 may extend in the third direction, and a plurality of bit lines 420 may be spaced apart from each other in the second direction.

Upper contact plugs contacting upper surfaces of the gate electrodes 380, respectively, and upper wirings for applying electrical signals thereto may be further formed so that the vertical memory device may be manufactured.

As illustrated above, the seed layer 210 may be formed on the sidewall and the bottom of the channel hole 200 by the first deposition process using the first precursor that may include silane having a functional group containing nitrogen, the first preliminary blocking layer 220 may be formed on the sidewall and the bottom of the channel hole 200 by the second deposition process using both of the second precursor including MS and the third precursor that may include silane and a halogen element, and the second preliminary blocking layer may be formed on the first preliminary blocking layer 220 by the third deposition process using only the second precursor including MS. The first preliminary blocking layer 220 and the second preliminary blocking layer may form the third preliminary blocking layer 225 including polysilicon, and the third preliminary blocking layer 225 may be formed on the sidewall and the bottom of the channel hole 200. The third preliminary blocking layer 225 may be oxidized to form the first blocking layer 230 including silicon oxide.

During the second deposition process, the halogen element included in the third precursor may be pyrolized to remove the functional group including nitrogen in the seed layer 210, and may partially etch the first preliminary blocking layer 220 to reduce a thickness of the portion of the first preliminary blocking layer 220 at the upper portion of the channel hole 200. Thus, the first preliminary blocking layer 220 might not be thick at the entrance of the channel hole 200 during the second deposition process, and may be formed at the lower portion of the channel hole 200. Further, the portion of the first preliminary blocking layer 220 at the lower portion of the channel hole 200 may have thickness greater than that of the portion of the first preliminary blocking layer 220 at the upper portion of the channel hole 200.

The third deposition process may be further performed using only the second precursor including MS, and thus the portion of the second preliminary blocking layer on the first preliminary blocking layer 220 at the upper portion of the channel hole 200 may be relatively thick, and the third preliminary blocking layer 225 including the first preliminary blocking layer 220 and the second preliminary blocking layer may have a substantially uniform thickness along the sidewall of the channel hole 200. Particularly, a plurality of channel holes 200 may be arranged in the second and third directions, and the third preliminary blocking layers 225 in the channel holes 200, respectively, may have a uniform thickness.

During the second deposition process for forming the first preliminary blocking layer 220, nitrogen included in the seed layer 210 may be removed by the halogen element included in the third precursor, and thus the third preliminary blocking layer 225 may have substantially nitrogen-free polysilicon, and the oxidation process may be performed on the third preliminary blocking layer 225 to form the first blocking layer 230. The third preliminary blocking layer 225 may include polysilicon rather than nitride, and thus, even though a radical oxidation process instead of a heat oxidation process is performed, a portion of each of the fourth sacrificial layers 180 adjacent to the channel hole 200 might not be oxidized.

Accordingly, a thickness in a horizontal direction substantially parallel to the upper surface of the substrate 100 of portions of the first blocking pattern 235 included in the charge storage structure 265, which may be adjacent to the insulation layer 170 and the fourth sacrificial layer 180, respectively, may be substantially equal to each other. For example, a thickness in the horizontal direction of the first blocking pattern 235 may be substantially uniform in the first direction, and a surface of the first blocking pattern 235 may be flat (e.g. planar). Thus, the first blocking pattern 235 may have desired characteristics.

When the second deposition process is performed on the seed layer 210 having a functional group containing nitrogen under a hydrogen atmosphere, the halogen element included in the third precursor may be pyrolized even at a low temperature to have an etching effect, and thus the processes for forming the first preliminary blocking layer 220 and the first blocking layer 230 may be performed at a low temperature such that the degradation of the neighboring structures by a high temperature process may be prevented.

FIG. 14 is a graph illustrating a concentration of chlorine remaining in the first blocking pattern 235 according to a distance from the sidewall of the channel hole 200 when the second deposition process for forming the first preliminary blocking layer 220 is performed using DCS as the third precursor.

Referring to FIGS. 13 and 14, the chorine concentration in the first blocking pattern 235 gradually decreases from an outer sidewall of the first blocking pattern 235 facing the gate electrode 380 or the second blocking pattern 370 toward an inner sidewall of the first blocking pattern 235 facing the charge storage pattern 245. This is because when the first preliminary blocking layer 220 is deposited from the sidewall of the channel hole 200 during the second deposition process, chlorine included in the third precursor may be pyrolized to be removed together with the functional group containing nitrogen of the seed layer 210. Accordingly, even if the third precursor includes other halogen elements, e.g., fluorine, bromine, iodine, etc., the concentration of the other halogen elements may be similar.

In exemplary embodiments of the present disclosure, a chlorine concentration at the inner sidewall of the first blocking pattern 235 may be less than or equal to about ⅕ (e.g., 1/10) of a chlorine concentration at the outer sidewall of the first blocking pattern 235. In an exemplary embodiment of the present disclosure, the chlorine concentration in the first blocking pattern 235 may gradually decrease from the outer sidewall toward the inner sidewall until a central portion in the horizontal direction, and may be substantially uniform from the central portion to the inner sidewall.

The vertical memory device manufactured by the above processes may have following structural characteristics.

The vertical memory device may include the channels 275 on the substrate 100 extending in the first direction. The channel connection pattern 340 contacts the channels 275 on the substrate 100. The charge storage structure 265 is disposed on an outer sidewall of each of the channels 275 and includes the tunnel insulation pattern 255, the charge storage pattern 245, and the first blocking pattern 235 sequentially stacked in the horizontal direction. The gate electrodes 380 are spaced apart from each other in the first direction on the channel connection pattern 340 and surround the charge storage structure 265. The division patterns 390 are disposed on the substrate 100 and penetrate through the gate electrodes 380 and extend in the second direction to separate the gate electrodes 380 in the third direction. The bit lines 420 are spaced apart from each other in the second direction and extend in the third direction on and being electrically connected to the channels 275.

In exemplary embodiments of the present disclosure, the first blocking pattern 235 may include silicon oxide containing a halogen element, e.g., fluorine, chlorine, bromine, iodine, etc., and a concentration of the halogen element in the first blocking pattern 235 may gradually decrease from the outer sidewall facing the gate electrode 380 toward the inner sidewall facing the charge storage pattern 245.

In exemplary embodiments of the present disclosure, the concentration of the halogen element in the first blocking pattern 235 at the inner sidewall may be less than or equal to about ⅕ of the concentration of the halogen element in the first blocking pattern 235 at the outer sidewall.

In exemplary embodiments of the present disclosure, the concentration of the halogen element in the first blocking pattern 235 may gradually decrease from the outer sidewall toward the inner sidewall until a central portion in the horizontal direction, and may be substantially uniform from the central portion to the inner sidewall.

In exemplary embodiments of the present disclosure, the first blocking pattern 235 may be substantially nitrogen-free.

In exemplary embodiments of the present disclosure, a thickness in the horizontal direction of the first blocking pattern 235 may be substantially uniform in the vertical direction, and thus the inner and outer sidewalls of the first blocking pattern 235 may be substantially flat (e.g. planar).

In exemplary embodiments of the present disclosure, the second blocking pattern 370 may cover lower and upper surfaces and a sidewall facing the charge storage structure 265 of each of the gate electrodes 380, and may include a metal oxide.

While exemplary embodiments of the present disclosure have been particularly shown and described, it will be understood by one of ordinary skill in the art that variations in form and detail may be made therein without departing from the spirit and scope of the claims.

What is claimed is:

1. A vertical memory device, comprising:
   a channel on a substrate, the channel extending in a vertical direction substantially perpendicular to an upper surface of the substrate;
   a charge storage structure on an outer sidewall of the channel, the charge storage structure including a tunnel insulation pattern, a charge storage pattern and a first blocking pattern sequentially stacked in a horizontal direction substantially parallel to the upper surface of the substrate; and
   gate electrodes spaced apart from each other in the vertical direction on the substrate, each of the gate electrodes surrounding the charge storage structure,
   wherein the first blocking pattern includes silicon oxide containing a halogen element, and
   wherein a concentration of the halogen element included in the first blocking pattern gradually decreases from an outer sidewall facing a corresponding one of the gate electrodes toward an inner sidewall facing the charge storage pattern.

2. The vertical memory device of claim 1, wherein a concentration of the halogen element at the inner sidewall of the first blocking pattern is less than or equal to about ⅕ of a concentration of the halogen element at the outer sidewall of the first blocking pattern.

3. The vertical memory device of claim 1, wherein the concentration of the halogen element in the first blocking pattern gradually decreases from the outer sidewall toward the inner sidewall until a central portion in the horizontal direction, and is substantially uniform from the central portion to the inner sidewall.

4. The vertical memory device of claim 1, wherein the first blocking pattern includes chlorine as the halogen element.

5. The vertical memory device of claim 1, wherein the first blocking pattern is substantially nitrogen-free.

6. The vertical memory device of claim 1, wherein a thickness in the horizontal direction of the first blocking pattern is substantially uniform along the vertical direction, such that both of the outer and inner sidewalls of the first blocking pattern are substantially flat.

7. The vertical memory device of claim 1, further comprising a second blocking pattern covering lower and upper surfaces and a sidewall facing the charge storage structure of each of the gate electrodes, the second blocking pattern including a metal oxide.

8. The vertical memory device of claim 1, wherein a lowermost one of the gate electrodes is a ground selection line (GSL), an uppermost one and at least one directly under the uppermost one of the gate electrodes serve as string selection lines (SSLs), respectively, and ones of the gate electrodes between the GSL and the SSL serve as word lines, respectively.

9. A vertical memory device, comprising:
a channel on a substrate, the channel extending in a vertical direction substantially perpendicular to an upper surface of the substrate;
a charge storage structure on an outer sidewall of the channel, the charge storage structure including a tunnel insulation pattern, a charge storage pattern and a first blocking pattern sequentially stacked in a horizontal direction substantially parallel to the upper surface of the substrate, the first blocking pattern including a halogen element; and
gate electrodes spaced apart from each other in the vertical direction on the substrate, each of the gate electrodes surrounding the charge storage structure,
wherein a thickness in the horizontal direction of the first blocking pattern is substantially uniform in the vertical direction, such that both of outer and inner sidewalls of the first blocking pattern are substantially flat, and
wherein a concentration of the halogen element at the inner sidewall of the first blocking pattern is less than a concentration of the halogen element at the outer sidewall of the first blocking pattern.

10. The vertical memory device of claim 9, wherein the concentration of the halogen element at the inner sidewall of the first blocking pattern is less than or equal to about ⅕ of the concentration of the halogen element at the outer sidewall of the first blocking pattern.

11. The vertical memory device of claim 9, wherein the concentration of the halogen element in the first blocking pattern gradually decreases from the outer sidewall toward the inner sidewall until a central portion in the horizontal direction, and is substantially uniform from the central portion to the inner sidewall.

12. The vertical memory device of claim 9, wherein halogen element of the first blocking pattern includes chlorine.

13. The vertical memory device of claim 9, wherein the first blocking pattern is substantially nitrogen-free.

14. The vertical memory device of claim 9, further comprising a second blocking pattern covering lower and upper surfaces and a sidewall facing the charge storage structure of each of the gate electrodes, the second blocking pattern including a metal oxide.

15. A vertical memory device, comprising:
channels on a substrate, each of the channels extending in a first direction substantially perpendicular to an upper surface of the substrate;
a channel connection pattern on the substrate, the channel connection pattern contacting the channels;
a charge storage structure on an outer sidewall of each of the channels on the channel connection pattern, the charge storage structure including a tunnel insulation pattern, a charge storage pattern, and a first blocking pattern sequentially stacked in a horizontal direction substantially parallel to the upper surface of the substrate;
gate electrodes spaced apart from each other in the first direction on the channel connection pattern, each of the gate electrodes surrounding the charge storage structure;
division patterns on the substrate, each of the division patterns penetrating through the gate electrodes and extending in a second direction substantially parallel to the upper surface of the substrate to separate each of the gate electrodes in a third direction substantially parallel to the upper surface of the substrate and crossing the second direction; and
bit lines spaced apart from each other in the second direction, each of the bit lines extending in the third direction on the channels, the bit lines being electrically connected to the channels,
wherein the first blocking pattern includes silicon oxide containing a halogen element, and
wherein a concentration of the halogen element included in the first blocking pattern gradually decreases from an outer sidewall facing a corresponding one of the gate electrodes toward an inner sidewall facing the charge storage pattern.

16. The vertical memory device of claim 15, wherein a concentration of the halogen element at the inner sidewall of the first blocking pattern is less than or equal to about ⅕ of a concentration of the halogen element at the outer sidewall of the first blocking pattern.

17. The vertical memory device of claim 15, wherein the concentration of the halogen element in the first blocking pattern gradually decreases from the outer sidewall toward the inner sidewall until a central portion in the horizontal direction, and is substantially uniform from the central portion to the inner sidewall.

18. The vertical memory device of claim 15, wherein the first blocking pattern is substantially nitrogen-free.

19. Tice vertical memory device of claim 15, wherein a thickness in the horizontal direction of the first blocking pattern is substantially uniform along the first direction, such that both of the outer and inner sidewalls of the first blocking pattern are substantially flat.

20. The vertical memory device of claim 15, further comprising a second blocking pattern covering lower and upper surfaces and a sidewall facing the charge storage structure of each of the gate electrodes, the second blocking pattern including a metal oxide.

* * * * *